United States Patent [19]
Morris

[11] Patent Number: 5,239,612
[45] Date of Patent: Aug. 24, 1993

[54] METHOD FOR RESISTANCE HEATING OF METAL USING A PYROLYTIC BORON NITRIDE COATED GRAPHITE BOAT

[75] Inventor: Joseph M. Morris, Lincoln, R.I.

[73] Assignee: Praxair S.T. Technology, Inc., Danbury, Conn.

[21] Appl. No.: 810,910

[22] Filed: Dec. 20, 1991

[51] Int. Cl.$^5$ .............................. C23C 13/12; B01B 1/00
[52] U.S. Cl. ........................................ 392/389; 392/388; 118/726; 118/696; 219/425; 432/4; 432/44
[58] Field of Search ................................ 392/388-389; 219/425, 492, 423; 118/726-727, 696, 699; 427/49-51; 432/44, 43, 4

[56] References Cited

U.S. PATENT DOCUMENTS

| | | | |
|---|---|---|---|
| 3,177,844 | 4/1965 | Lins | 427/50 |
| 3,537,886 | 11/1970 | Rively et al. | 427/50 |
| 4,183,975 | 1/1980 | Sidders | 427/50 |
| 4,264,803 | 4/1981 | Shinko | 219/275 |
| 4,327,122 | 4/1982 | Chakupurakal | 118/726 |
| 4,846,834 | 7/1989 | von Recum et al. | 427/2 |

FOREIGN PATENT DOCUMENTS

| | | | |
|---|---|---|---|
| 2216959 | 10/1973 | Fed. Rep. of Germany | 392/388 |
| 16-18932 | 11/1941 | Japan | 118/726 |
| 58-42054 | 3/1983 | Japan | 427/50 |

Primary Examiner—Bruce A. Reynolds
Assistant Examiner—John A. Jeffery
Attorney, Agent, or Firm—E. Lieberstein

[57] ABSTRACT

A method of resistance heating using a graphite container having a graphite body and a pyrolytic boron nitride coating in which a metal charge of predetermined weight is deposited over the coating and the container is heated by the application of a variable source of electrical power to cause the metal charge to fully evaporate in a short interval of time of less than two minutes with the heat cycle controlled to provide a cool down period in each cycle of applied power and with a new metal charge introduced upon completion of each heat cycle in a semi-continuous fashion.

2 Claims, 1 Drawing Sheet

METHOD FOR RESISTANCE HEATING OF METAL USING A PYROLYTIC BORON NITRIDE COATED GRAPHITE BOAT

FIELD OF THE INVENTION

This invention relates to metal vaporization and more particularly to an improved method for resistance heating of metal using a graphite container having a pyrolytic boron nitride coating.

BACKGROUND OF THE INVENTION

Many metals such as aluminum, copper, chromium, zinc and tin are coated onto various substrates such as metal, glass and plastic by a vacuum deposition process in which a container is heated by electric resistance heating to vaporize metal fed into contact with the container. The container, which is commonly referred to as a "boat", is connected in an electric circuit in a series circuit relationship so that current flows directly through the boat, which in turn heats the metal in contact with the boat until it vaporizes. The metal is vaporized in an evacuated atmosphere for coating a product which may be individually introduced into the evacuated chamber or continuously fed through the chamber. Discreet products may include a television picture tube, an automobile head light, a toy or the like.

Presently, most resistance heated containers are composed of an intermetalic ceramic composite of titanium diboride and boron nitride alone or in combination with aluminum nitride. The composite has a very short lifetime and requires continual adjustment of the power supply. Moreover, the resistance characteristics of such heaters are not stable during operation since the metal component of the ceramic composite is a conductor which forms part of the electrical circuit. As a result metal vaporization is not uniform resulting in a non-uniform metal deposition.

A container of graphite coated with pyrolytic boron nitride has been suggested for use as an alternative to a resistance heater composed of an intermetallic ceramic composite. The coating of pyrolytic boron nitride is intended to electrically isolate the molten metal in the container from the current path through the graphite body and to supply more uniform heat to the metal. It has instead been discovered that the molten metal after only a short time interval will pass through the layer planes of the pyrolytic boron nitride coating and directly infiltrate the porous graphite body. Changes in the thermal cycle causes the boron nitride coating to crack within a short operating time interval. This destroys the utility of the graphite for use as a metal evaporator. Increasing the thickness of the pyrolytic boron nitride coating can delay, but will not significantly prevent leakage through the boron nitride coating.

SUMMARY OF THE INVENTION

It was discovered in accordance with the present invention that a graphite container coated with boron nitride may be used for vaporizing metal in contact with the container through heat conduction and will provide an extended service life if the metal to be vaporized is deposited in a semi-continuous fashion while varying the applied power to the container to provide a controlled heat cycle in which the applied power is applied over a fixed time period sufficient to fully evaporate the metal charge, preferably in less than two minutes, and to provide-de a cool down period before reintroducing a new metal charge.

The method of resistance heating is carried out in accordance with the present invention using a graphite container having a graphite body and a pyrolytic boron nitride coating and comprises the steps of: depositing a metal charge of predetermined weight into said container over said boron nitride coating; applying electrical power to said container such that current flows directly through the graphite body to cause the metal charge to fully evaporate within a finite time interval of less than two minutes; varying the electrical power being applied to said container to control the heat cycle across said boron nitride coating and to provide a cool down period in each cycle of applied power and introducing a new charge of metal into said container in a semi-continuous fashion upon completion of each heat cycle.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
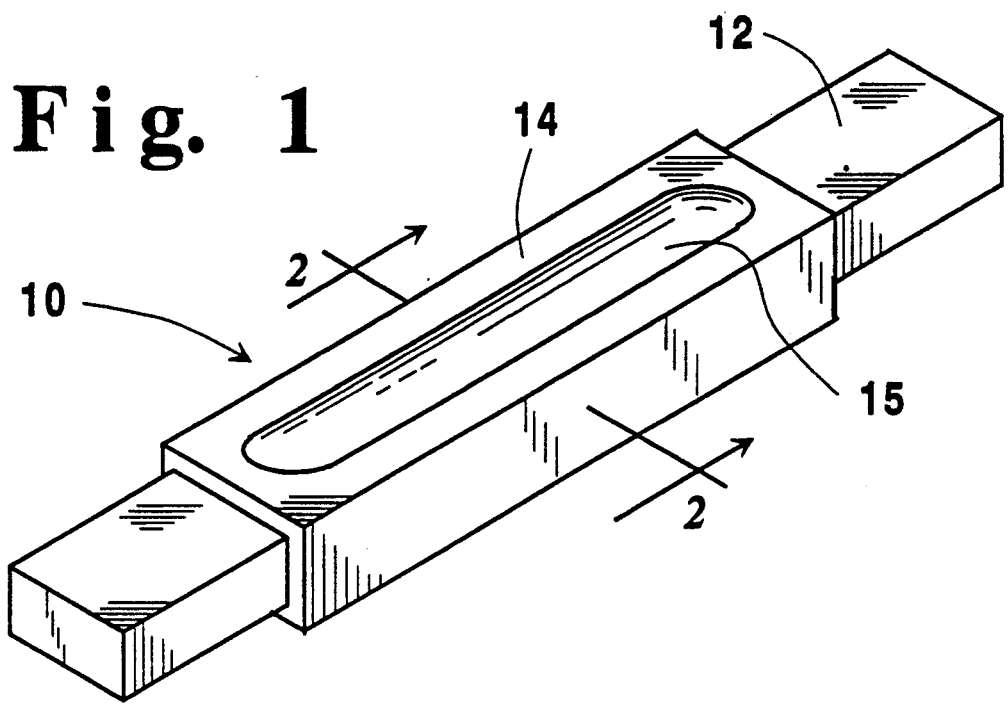
FIG. 1 is a perspective view of a graphite metal evaporator with a pyrolytic boron nitride coating for use in accordance with the present invention.
Figure 2:
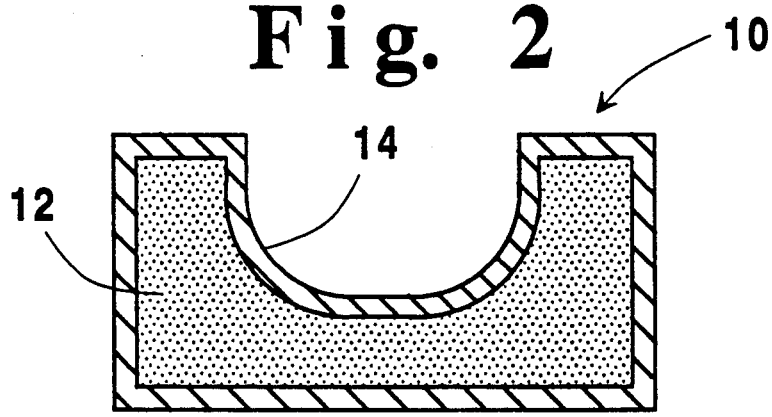
FIG. 2 is a cross section taken along the lines 2—2 of FIG. 1.

The resistance heater 10 as shown in FIG. 1 comprises a graphite body 12 with a pyrolytic boron nitride coating 14 covering a specified area of the graphite body 12 in which a depression 15 is formed. The graphite body 12 is a mechanical block of high strength graphite. The depression 15 can be of any desired shape or geometry, preferably rounded as is shown in FIG. 2 with hemispherical ends as shown in FIG. 1, to receive and hold a metal charge (not shown) to be vaporized by the resistance heater 10. The metal charge may be composed of any metal selected from the group consisting of aluminum, copper, zinc and tin and may be in the form of one or more pieces having a total weight of preferably between 6 mg to 200 mg.

The graphite body 12 is preferably of a rectangular configuration having a predetermined cross sectional area to provide a defined resistance path which will optimize the heat generated therein for a given applied voltage to assure complete evaporation of the metal charge under controlled heat cycle conditions as hereinafter discussed. The graphite body 12 must be properly sized to allow it to cause evaporation of the metal charge within the desired time interval. The applied voltage, cross sectional area and length of the graphite body 12 will determine the heat cycle time. To achieve full evaporation of the metal charge in less than two minutes with an applied voltage of from 4 to 25 volts it is necessary for the graphite body 12 to have a maximum cross sectional area of between about 0.02 square inch (15 mm$^2$) and 0.11 square inch (72 mm$^2$) and a maximum length of 8 inches although preferably less than 5 inches. An evaporator with a 15 sq. mm cross section and a 200 mm length would require an applied voltage of 25 volts whereas a 72 sq. mm cross section and a 75 mm length requires an applied voltage of only 4 volts.

A coating of pyrolytic boron nitride 14 may be formed on the graphite body 12 by passing gaseous vapors of ammonia and boron halide e.g. boron trichloride as reactants into a heated reactor (not shown). The temperature of the reactor is elevated to a temperature of up to 2300° C. at a pressure of less than 50 mm of mercury to form a coating, by chemical vapor deposition, of boron nitride as is taught in U.S. Pat. No. 3,152,226 the disclosure of which is herein incorporated by reference. The pyrolytic boron nitride coating 14 must be thin enough to maximize heat transfer into the metal charge so as to permit evaporation within the desired fixed time interval of less than two minutes and yet must be thick enough to maintain its structural integrity over an extended service lifetime with constant heat cycle variations. The preferred thickness range for the pyrolytic boron nitride coating should be between 0.010 and 0.020 inches.

Figure 3:
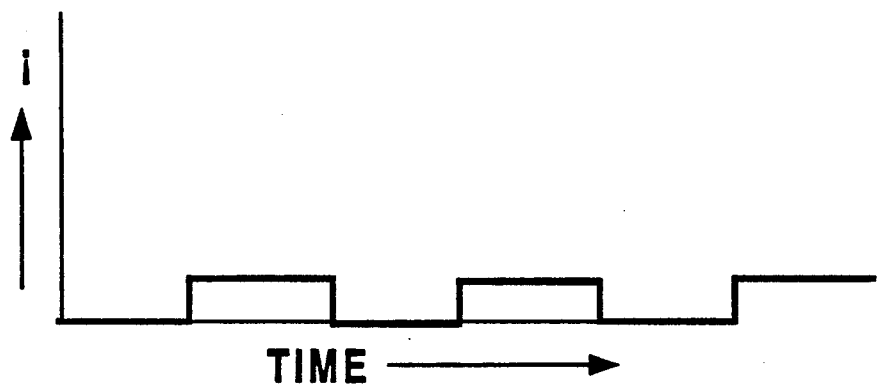
FIG. 3 is a plot of the current flow pattern through the evaporator of FIG. 1 during the practice of the present invention.

The service life of the heater 10 has proven to be orders of magnitude greater than conventional resistance heaters. The heater 10 is operated in a semi-continuous fashion with a metal charge fully evaporated during each heat cycle in a period of under two minutes. In each cycle of operation power is applied for a short interval coincident with the time required to fully evaporate the metal charge and includes a cool down period before reapplying power. This results in a current flow pattern as shown in FIG. 3 in which the current is almost constant over the time period required to cause full evaporation of the metal charge followed by a cool down period in which a new metal charge is deposited before power is reapplied. By operating the heater 10 in this semi-continuous fashion the pyrolytic boron nitride coating 14 acts only as an insulating barrier with no leakage of metal through the boron nitride coating 14 into the graphite body 12.

What is claimed is:

1. A method of resistance heating using a graphite container having a graphite body with a maximum cross sectional area of between 15 sq. mm and 72 sq. mm and a maximum length of 8 inches and a pyrolytic boron nitride coating of between 0.010 and 0.020 inches thick comprising the steps of: depositing a metal charge selected from the group consisting of aluminum, copper, zinc and tin with said metal charge having a predetermined weight of between 6 mg and 200 mg into said container with the boron nitride coating separating the graphite body from the metal charge; applying electrical power with a constant current and a variable voltage of between 4 to 25 volts to said graphite container for a controlled short interval of time sufficient to cause the metal charge to fully evaporate in said time interval and the current to flow directly through said graphite body; varying the electrical power applied to said container to control the heat cycle across said coating with said electrical power being interrupted repetitively to provide a minimum cool down period with essentially no current flow between each application of applied power and introducing a new charge of metal into said container during said cool down period.

2. A method of resistance heating as defined in claim 1 wherein said fixed short interval of time is less than two (2) minutes.

* * * * *